(12) United States Patent
Wu et al.

(10) Patent No.: US 10,862,490 B2
(45) Date of Patent: Dec. 8, 2020

(54) FD-SOI DEVICE CALIBRATION CIRCUIT AND METHOD THEREFOR

(71) Applicant: NXP USA, INC., Austin, TX (US)

(72) Inventors: Xiaolei Wu, Tianjin (CN); Yin Guo, Tianjin (CN); Haitian Zhou, Tianjin (CN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/438,477

(22) Filed: Jun. 12, 2019

(65) Prior Publication Data
US 2020/0044627 A1 Feb. 6, 2020

(30) Foreign Application Priority Data
Aug. 2, 2018 (CN) .......................... 2018 1 0874429

(51) Int. Cl.
| | |
|---|---|
| *H03L 7/099* | (2006.01) |
| *H03K 3/03* | (2006.01) |
| *H03K 3/011* | (2006.01) |
| *H03L 7/08* | (2006.01) |

(52) U.S. Cl.
CPC ............ *H03L 7/0995* (2013.01); *H03K 3/011* (2013.01); *H03K 3/0315* (2013.01); *H03L 7/0805* (2013.01); *H03K 2217/0018* (2013.01)

(58) Field of Classification Search
CPC ......... H03K 3/0315; H03K 2217/0018; H03K 3/011; H03L 7/0995; H03L 7/0805; G05F 3/025
See application file for complete search history.

(56) References Cited

U.S. PATENT DOCUMENTS

| | | | | |
|---|---|---|---|---|
| 5,959,502 | A | * 9/1999 | Ovens | .................. H03K 3/0231 331/17 |
| 6,466,077 | B1 | * 10/2002 | Miyazaki | ................ G05F 3/205 326/33 |
| 7,683,433 | B2 | 3/2010 | Kapoor et al. | |
| 9,496,881 | B2 | * 11/2016 | Zhao | ......................... H03G 3/20 |
| 9,531,374 | B2 | 12/2016 | Bailey | |
| 2017/0188144 | A1 | * 6/2017 | Vinter | ..................... G05F 3/205 |

OTHER PUBLICATIONS

Masayuki Miyazaki et al., "A 1.2-GIPS/W Microprocessor Using Speed-Adaptive Threshold-Voltage CMOS With Forward Bias", IEEE Journal of Solid-State Circuits, vol. 37, No. 2, Feb. 2002.

* cited by examiner

*Primary Examiner* — Ryan Johnson

(57) ABSTRACT

A calibration circuit for body biasing includes a phase detector, first and second voltage generators, and first and second voltage regulators. The phase detector has an input terminal configured to receive an oscillation signal from a ring oscillator. The phase detector provides output signals indicative of phase differences between the oscillation signal and a reference signal. The first voltage generator provides a first reference voltage using the output signals from the phase detector, and the first voltage regulator provides a first biasing voltage using the first reference voltage. The second voltage generator provides a second reference voltage using the first reference voltage, and the second voltage regulator provides a second biasing voltage using the second reference voltage. The first biasing voltage is used to bias P-wells of transistors in the ring oscillator, and the second biasing voltage is used to bias N-wells of transistors in the ring oscillator.

20 Claims, 4 Drawing Sheets

FD-SOI DEVICE CALIBRATION CIRCUIT AND METHOD THEREFOR

BACKGROUND

The present invention generally relates to well biasing for Fully Depleted-Silicon on Insulator (FD-SOI) devices, and, more particularly, to a circuit for calibrating body biasing voltages and a method therefor.

Body biasing, either forward body biasing (FBB) or reverse body biasing (RBB), typically is used in FD-SOI processes for calibrating well bias voltages. However, during device operation, device performance inevitably will deteriorate due to temperature and/or voltage changes. In addition, aging also will affect device performance.

It would be advantageous to have a circuit and method that calibrates FD-SOI device body biasing.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, the present invention provides a calibration circuit for body biasing. The calibration circuit includes a phase detector, first and second voltage generators, and first and second voltage regulators. The phase detector has an input terminal configured to receive an oscillation signal from a ring oscillator. The phase detector is configured to provide output signals indicative of phase differences between the oscillation signal and a reference signal. The first voltage generator is configured to provide a first reference voltage using the output signals from the phase detector. The first voltage regulator is configured to provide a first regulated voltage using the first reference voltage as a first biasing voltage. The second voltage generator is configured to provide a second reference voltage using the first reference voltage, and the second voltage regulator is configured to provide a second regulated voltage using the second reference voltage as a second biasing voltage.

In another embodiment, the present invention provides a method for calibrating the body bias of a ring oscillator. The method includes detecting, by a phase detector, a phase difference between an oscillation signal from the ring oscillator and a reference signal, and providing output signals indicative of the phase difference. A first voltage generator generates a first reference voltage using the output signals. A first voltage regulator provides, using the first reference voltage, a first regulated voltage as a first biasing voltage. A second voltage generator, using the first reference voltage, generates a second reference voltage. A second voltage regulator, using the second reference voltage, provides a second regulated voltage as a second biasing voltage.

BRIEF DESCRIPTION OF THE DRAWINGS

So that the manner in which the above recited features of the present invention can be understood in detail, a more detailed description of the invention may be had by reference to embodiments, some of which are illustrated in the appended drawings. The appended drawings illustrate only typical embodiments of the invention and should not limit the scope of the invention, as the invention may have other equally effective embodiments. The drawings are for facilitating an understanding of the invention and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
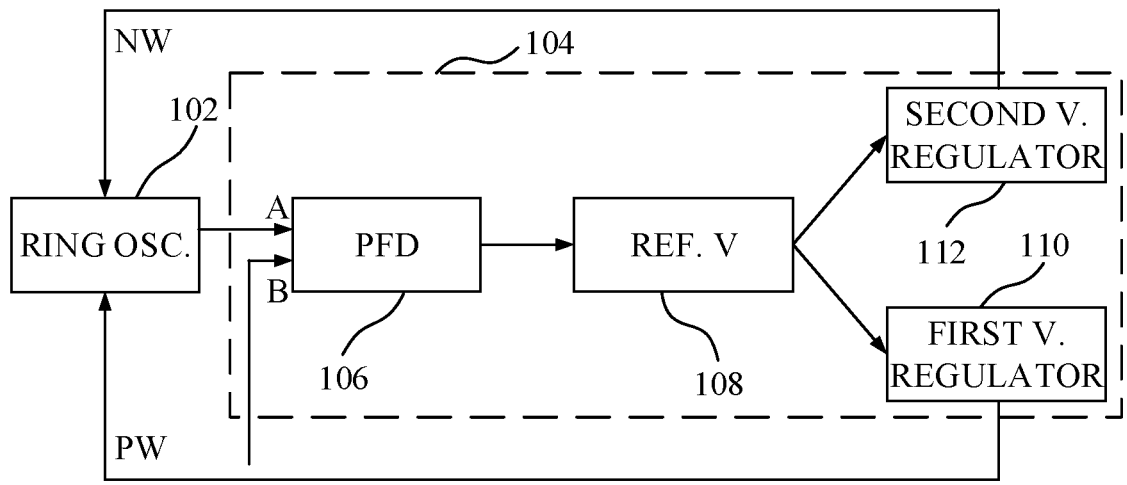
FIG. 1 is a schematic block diagram of a ring oscillator and a calibration circuit according to an embodiment of the present invention.

FIG. 1 is a block diagram of a ring oscillator 102 and a calibration circuit 104 according to an exemplary embodiment of the present invention. The calibration circuit 104 provides body biasing signals NW and PW respectively for N-wells and P-wells of transistors in the ring oscillator 102. The calibration circuit 104 includes a phase and frequency detector (PFD) 106, a reference voltage generator 108, a first voltage regulator 110, and a second voltage regulator 112.

The PFD 106 receives an oscillation signal on a first input terminal A from the ring oscillator 102, and a reference signal on a second input terminal B. The reference signal may comprise a clock signal provided from a crystal oscillator (not shown). The PFD 106 detects phase and frequency differences between the oscillation signal and the reference signal, and generates output signals indicative of such differences. The output signals from the PFD 106 indicate that the frequency of the oscillation signal is higher or lower than the frequency of the reference signal. The output signals from the PFD 106 are provided to the reference voltage generator 108.

The reference voltage generator 108 generates first and second reference voltages in response to the output signals from the PFD 106, and provides the reference voltages respectively to the first and the second voltage regulators 110 and 112. The first and second voltage regulators 110 and 112 then use the respective first and second reference voltages to generate first and second biasing signals (PW and NW).

Figure 2:
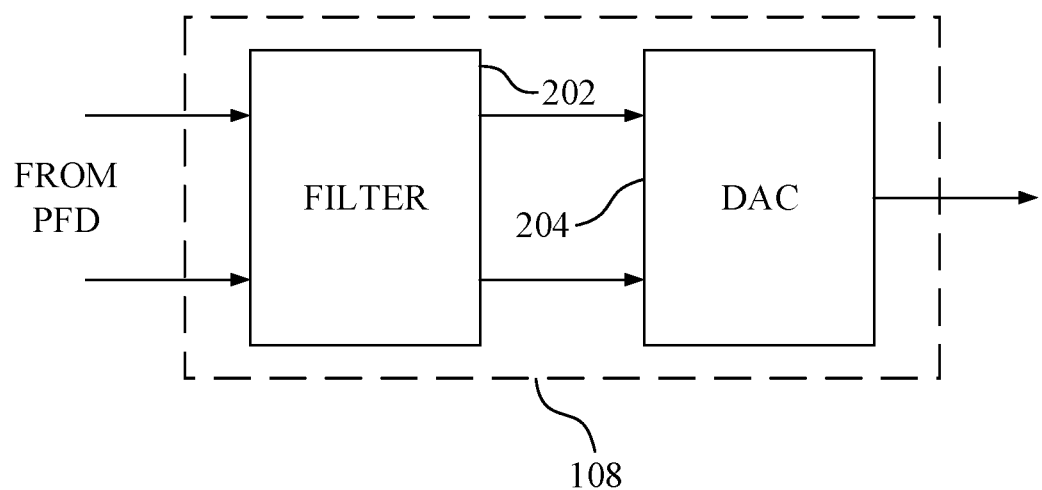
FIG. 2 is a block diagram of a reference voltage generator of the circuit of FIG. 1 according to an exemplary embodiment of the present invention.

FIG. 2 is a block diagram of the reference voltage generator 108 according to an exemplary embodiment of the present invention. In a digital implementation, the reference voltage generator 108 includes a filter 202 and a digital-to-analog converter (DAC) 204. The filter 202 can be implemented as a digital filter, which receives the output signals from the PFD 106, and generates filtered output signals to be converted by the DAC 204. The digital filter 202 operates predetermined algorithms on the output signals from the PFD 106, to provide required compensation and/or computation on the output signals from the PFD 106. The DAC 204 receives the filtered output signals and converts them into a first reference voltage signal and/or a second reference voltage signal that are respectively provided to the first voltage regulator 110 and the second voltage regulator 112. However, the reference voltage generator 108 may be implemented as an analog circuit, which will be described below with reference to FIG. 3.

The first and second voltage regulators 110 and 112 respectively receive the first and second reference voltages, and generate first and second regulated voltages (i.e., the first and second body biasing signals). The first and second regulated voltages are provided back to the ring oscillator 102 as the biasing voltages for the N-wells and P-wells of transistors in the ring oscillator 102. Preferably, the first and second voltage regulators 110 and 112 are Low Dropout voltage regulators (LDO).

As noted above, the phase and frequency of the oscillation signal from the ring oscillator 102 are monitored. The detected difference/fluctuation of phase and frequency indicates that the biasing voltages for the transistors in the ring oscillator 102 need to be adjusted to stabilize the operation of the oscillator 102. The output signals from the PFD 106, which are indicative of such difference, are used for generating adjusted biasing voltages. The well biasing voltage of the transistors is dynamically calibrated, and the performance of the ring oscillator is stabilized.

Figure 3:
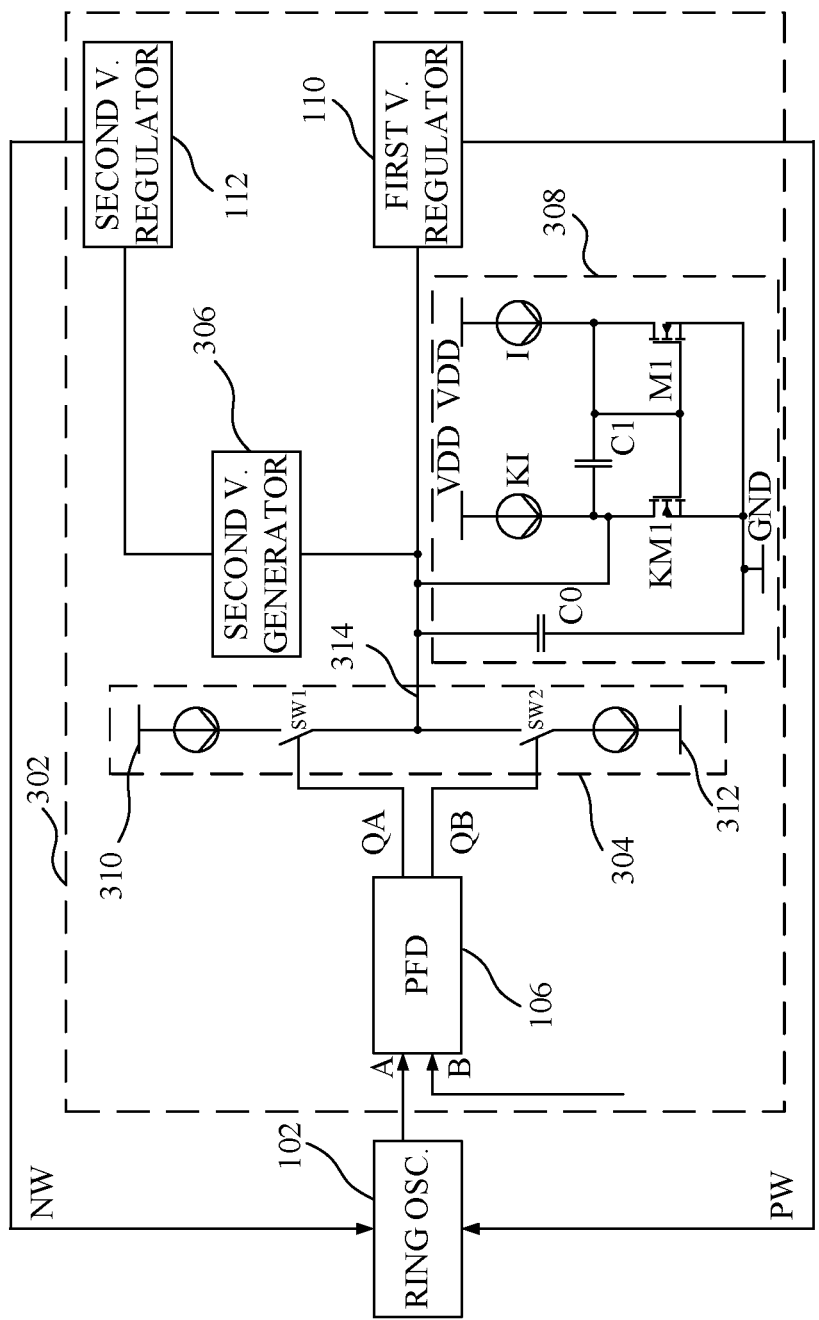
FIG. 3 is a schematic block diagram of a ring oscillator and a calibration circuit according to another embodiment of the present invention.

FIG. 3 shows another embodiment of a ring oscillator 102 and a calibration circuit 302 of the present invention, in which the reference voltage generators are implemented with analog circuitry. In FIG. 3, the parts that are similar to those in FIG. 1 are labelled with the same reference numbers. The calibration circuit 302 includes the PFD 106, a first voltage generator 304, a second voltage generator 306, the first voltage regulator 110, the second voltage regulator 112, and a compensation circuit 308.

The PFD 106 has a first output terminal QA and a second output terminal QB. A first output signal on the first output terminal QA indicates that the frequency of the oscillation signal is higher than the frequency of the reference signal, and a second output signal on the second output terminal QB indicates that the frequency of the oscillation signal is lower than the frequency of the reference signal.

The first voltage generator 304 includes a first voltage source 310, a second voltage source 312, and an output terminal 314. The first voltage generator 304 further includes a first switch SW1 and a second switch SW2 coupled in series between the first and second voltage sources 310 and 312. The output terminal 314 is coupled between the first and second switches SW1 and SW2. The first switch SW1 operates in response to the first output signal QA, and the second switch SW2 operates in response to the second output signal QB. When the first switch SW1 is closed, in response to the first output signal QA from the PFD 106, the first voltage source 310 is coupled to the output terminal 314. When the second switch SW2 is closed, in response to the second output signal QB from the PFD 106, the second voltage source 312 is coupled to the output terminal 314.

The second voltage generator 306 produces a second reference voltage from the first reference voltage. In the current embodiment, the second voltage generator 306 generates the second reference voltage such that the second reference voltage is a fraction of a source voltage by subtracting the first reference voltage from the source voltage.

The compensation circuit 308 is coupled between the first voltage generator 304 and the first voltage regulator 110. The compensation circuit 308 is used to compensate for poles in the loop caused by the first and second voltage regulators 110 and 112. The compensation circuit 308 includes a first capacitor C0, which is coupled between the output terminal 314 of the first voltage generator 304 and ground. The compensation circuit 308 further includes first and second current sources KI and I, both of which are coupled with a supply voltage VDD. In one embodiment, the first and second current sources KI and I are implemented as a first transistor and a second transistor both coupled as source followers. An output current of the first transistor KI is k times an output current of the second transistor I. The compensation circuit 308 includes a third transistor KM1 and a fourth transistor M1. The third transistor KM1 is coupled between the first transistor KI and ground, and the fourth transistor M1 is coupled between the second transistor I and ground. In the current embodiment, a transconductance of the third transistor KM1 is k times a transconductance of the fourth transistor M1. The compensation circuit 308 further includes a second capacitor C1, which has one side coupled to a node between the first transistor KI and the third transistor KM1, and a second side coupled to a node between the second transistor I and the fourth transistor M1. In addition, the second side of the second capacitor C1 is connected to the gates of the third and fourth transistors KM1 and M1.

Figure 4:
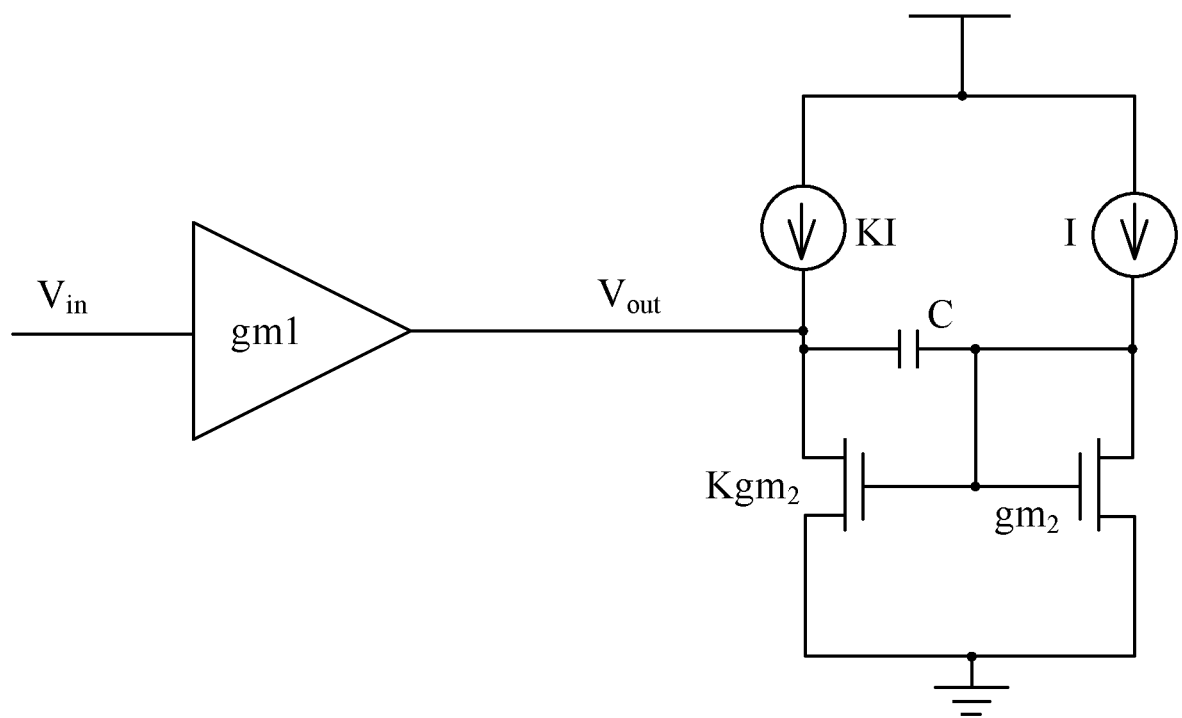
FIG. 4 is an equivalent circuit diagram of the circuit of FIG. 3.

FIG. 4 is an equivalent circuit diagram of an amplification system of the ring oscillator 102 and the calibration circuit 302 of FIG. 3. In the amplification system, the circuits except the compensation circuit 308 are equalized as an amplifier gm1, which receives an input voltage $V_{in}$ and provides an output voltage $V_{out}$. As described above, the first transistor KI provides a current KI, and the second transistor I provides a current I. The third transistor KM1 has a transconductance of Kgm2, the fourth transistor M1 has a transconductance of gm2, while the second capacitor C1 has a capacitance of C.

Figure 5:
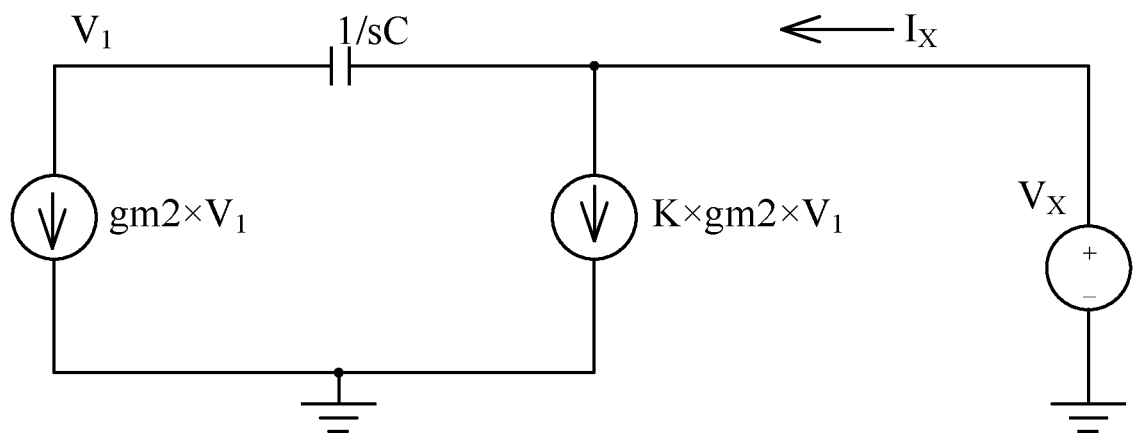
FIG. 5 is an equivalent circuit diagram of the compensation circuit of FIGS. 3 and 4.

FIG. 5 is an equivalent circuit diagram of the compensation circuit 308 of FIGS. 3 and 4. In FIG. 5, an equivalent current $I_X$ may be defined as:

$$I_X = (1+K) \times gm2 \times V_1;$$

wherein $V_1$ is an equivalent voltage of the circuit. A relationship between an equivalent voltage $V_X$ of the circuit and the equivalent input voltage $V_1$ can be given by:

$$V_1 = V_X - gm2 \times V_1 \times (1/sC).$$

An equivalent output resistance of the circuit can be defined as:

$$V_X/I_X = 1/((1+K) \times gm2) + 1/((1+K) \times sC.$$

Accordingly, the output voltage of the circuit of FIG. 3 is given by:

$$V_{out} = gm1 \times V_{in} \times (1/((1+K) \times gm2) + 1/((1+K) \times sC).$$

The equation above shows that the capacitance C of the second capacitor C1 is enlarged by 1+K times. Additionally, the compensation circuit 308 provides a series resistor of $1/((1+K) \times gm2)$ for compensation.

The second capacitor C1 is coupled between a first branch of the first transistor KI and the third transistor KM1, and a second branch of the second transistor I and the fourth transistor M1, and is enlarged by 1+K times to compensate for the pole introduced by the first and second voltage regulators 110 and 112. Accordingly, the second capacitor C1 itself does not need to be very large, and thus saves circuit area and design effort.

Figure 6:
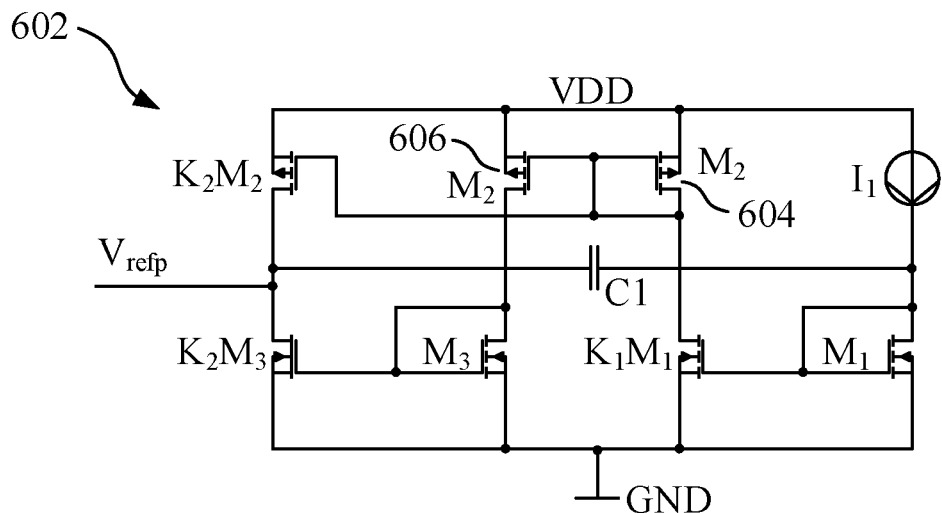
FIG. 6 is a schematic circuit diagram of a compensation circuit according to another embodiment of the present invention.

Turning now to FIG. 6, a circuit diagram of a compensation circuit 602 according to another embodiment of the present invention is shown. The compensation circuit 602 enlarges the capacitance of the second capacitor C1 using a two-stage amplification circuit, which allows for the capacitance to be enlarged without requiring very large transistors. The compensation circuit 602 includes a first transistor 604 labelled $M_2$, a second transistor $I_1$, a third transistor indicated as $K_1M_1$, a fourth transistor $M_1$, a fifth transistor 606 also labelled $M_2$, a sixth transistor $M_3$, a seventh transistor indicated as $K_2M_2$, and an eighth transistor indicated as $K_2M_3$. The second transistor $I_1$ is coupled as a current source to provide the current $I_1$. The current $I_1$ is amplified $K_1$ times by the third transistor $K_1M_1$, and the current passing through the first transistor 604, labelled $M_2$ in FIG. 6, is $K_1I_1$. The compensation circuit 602 further includes a fifth transistor 606, which is labelled as $M_2$ because it is coupled as a mirror transistor with the first transistor 604 and is the same as the first transistor 604. A sixth transistor $M_3$ is coupled between the fifth transistor 606 and ground. The fifth transistor 606 mirrors the current $K_1I_1$, and thus the current passing through the sixth transistor $M_3$ is $K_1I_1$. The compensation circuit 602 includes an additional amplification stage, which includes a seventh transistor $K_2M_2$ and an eighth transistor $K_2M_3$. The current $K_1I_1$ through the sixth transistor $M_3$ is amplified $K_2$ times by the additional amplification stage, so the amplified current passing through the seventh transistor $K_2M_2$ is $K_2K_1I_1$. The second capacitor C1 is coupled on one side to a node between the seventh and eighth transistors $K_2M_2$ and $K_2M_3$, and on the other side to a node between the second and fourth transistors $I_1$ and $M_1$. According to the compensation circuit 602, the capacitance of the second capacitor C1 is enlarged $1+K_1 \times K_2$ times. The two-stage amplification avoids requiring the transistors to be exceptionally large when there is large amplification requirement.

Figure 7:
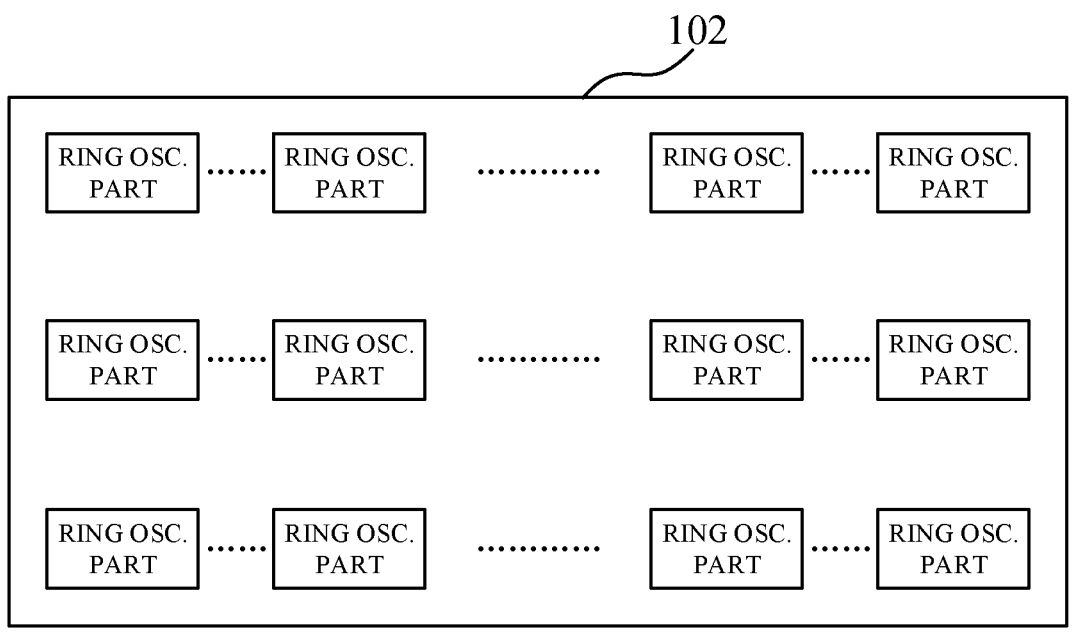
FIG. 7 is a schematic block diagram of a ring oscillator according to an exemplary embodiment of the present invention.

FIG. 7 is a block diagram of the ring oscillator 102 according to an exemplary embodiment of the present invention. Typically, a ring oscillator includes a number series connected inverters, where each inverter includes a PMOS transistor and an NMOS transistor. According to the embodiment depicted in FIG. 7, the ring oscillator 102 includes N parts that are physically distributed. Each of the parts includes one or more transistor cells. The parts are electrically connected, for example through wires in a metal layer. The ring oscillator parts can be implemented to intersect with other circuit cells. The spaces between the ring oscillator parts can be placed with necessary circuit cells to save layout area. This is particularly useful when considering that the oscillator transistors must be placed far enough apart to avoid interference and well proximity effects.

The distributed configuration of the ring oscillator flattens the silicon process differences. That is, it is understood that temperatures, IR drops, and aging effects of the circuitry may vary area by area amongst various operations, such that the ring oscillator parts in different physical locations, and in some cases associated with specific logic modules, may experience performance degradation, which will impact the operation of the ring oscillator parts differently. The operational differences will be averaged by combining the ring oscillator parts into a complete ring oscillator. The generated biasing voltages by the calibration circuits of FIGS. 1 and 3 will reflect such impacts and, when applied to the oscillator parts, will adjust the well biasing. The biasing voltage adjustment is accordingly eased.

According to the embodiments, the calibration circuit 104 detects phase and frequency changes of the oscillation signals of the ring oscillator 102. These changes reflect the body biasing requirements. The detected changes are provided for generating adjusted body biasing voltages respectively for N-wells and P-wells in the transistors of the ring oscillator 102. Since the biasing voltages are generated in response to the oscillation signal changes, the biasing is accurate and dynamic.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A calibration circuit for body biasing, comprising:
a phase detector having an input terminal configured to receive an oscillation signal from a ring oscillator, wherein the phase detector is configured to provide output signals indicative of phase differences between the oscillation signal and a reference signal;
a first voltage generator configured to provide a first reference voltage using the output signals from the phase detector;
a first voltage regulator that receives the first reference voltage and generates a first regulated voltage as a first biasing voltage using the first reference voltage;
a second voltage generator configured to provide a second reference voltage using the first reference voltage; and
a second voltage regulator that receives the second reference voltage and generates a second regulated voltage as a second biasing voltage using the second reference voltage, wherein the first biasing voltage is provided for biasing P-wells of transistors in the ring oscillator, and the second biasing voltage is provided for biasing N-wells of transistors in the ring oscillator.

2. The calibration circuit of claim 1, wherein the phase detector comprises a first output terminal and a second output terminal, wherein:
a first output signal from the first output terminal is indicative of a frequency of the oscillation signal being higher than that of the reference signal; and
a second output signal from the second output terminal is indicative of the frequency of the oscillation signal being lower than that of the reference signal.

3. The calibration circuit of claim 2, wherein (i) the first voltage generator comprises a first voltage source, a second voltage source, and an output terminal, (ii) the first output signal from the first output terminal of the phase detector couples the first voltage source to the output terminal of the first voltage generator to provide the first reference voltage, and (iii) the second output signal from the second output terminal of the phase detector couples the second voltage source to the output terminal of the first voltage generator to provide the first reference voltage.

4. The calibration circuit of claim 1, wherein the second reference voltage is a fraction of a source voltage subtracting the first reference voltage.

5. The calibration circuit of claim 1, further comprising a compensation circuit coupled between the first voltage generator and the first voltage regulator.

6. A calibration circuit, comprising:
a phase detector having an input terminal configured to receive an oscillation signal from a ring oscillator, wherein the phase detector is configured to provide output signals indicative of phase differences between the oscillation signal and a reference signal;
a first voltage generator configured to provide a first reference voltage using the output signals from the phase detector;
a first voltage regulator that receives the first reference voltage and generates a first regulated voltage as a first biasing voltage using the first reference voltage;
a second voltage generator configured to provide a second reference voltage using the first reference voltage;
a second voltage regulator that receives the second reference voltage and generates a second regulated voltage as a second biasing voltage using the second reference voltage; and
a compensation circuit coupled between the first voltage generator and the first voltage regulator, wherein the compensation circuit comprises:
a first transistor coupled with a supply voltage;
a second transistor coupled with the supply voltage;
a third transistor coupled between the first transistor and ground;
a fourth transistor coupled between the second transistor and ground; and
a capacitor coupled between a node between the first and the third transistors and a node between the second and the fourth transistors.

7. The calibration circuit of claim 6, wherein the first biasing voltage is provided for biasing P-wells of transistors in the ring oscillator, and the second biasing voltage is provided for biasing N-wells of transistors in the ring oscillator.

8. The calibration circuit of claim 6, wherein the first transistor is coupled as a source follower, and the second transistor is coupled as a source follower.

9. The calibration circuit of claim 6, wherein the first and the second transistors are coupled as current sources.

10. The calibration circuit of claim 9, wherein an output current of the first transistor is k times an output current of the second transistor, and a transconductance of the third transistor is k times a transconductance of the fourth transistor.

11. A method for calibrating body bias of a ring oscillator, wherein the ring oscillator comprises a plurality of transistors, the method comprising:
detecting, by a phase detector, a phase difference between an oscillation signal from the ring oscillator and a reference signal, and providing phase detector output signals indicative of the phase difference;
generating, by a first voltage generator using the phase detector output signals, a first reference voltage;
providing, by a first voltage regulator using the first reference voltage, a first regulated voltage as a first biasing voltage;
generating, by a second voltage generator using the first reference voltage, a second reference voltage;
providing, by a second voltage regulator using the second reference voltage, a second regulated voltage as a second biasing voltage,
biasing P-wells of the transistors in the ring oscillator using the first biasing voltage; and
biasing N-wells of the transistors in the ring oscillator using the second biasing voltage.

12. The method of claim 11, wherein the detecting the phase difference and providing the phase detector output signals comprises:
providing a first output signal at a first output terminal of the phase detector indicative of a frequency of the oscillation signal being higher than the frequency of the reference signal; and
providing a second output signal at a second output terminal of the phase detector indicative of a frequency of the oscillation signal being lower than that of the reference signal.

13. The method of claim 12, wherein the generating the first reference voltage comprises one of:
coupling, using the first output signal, a first voltage source to an output terminal of the first voltage generator to provide the first reference voltage; and
coupling, using the second output signal, a second voltage source to the output terminal of the first voltage generator to provide the first reference voltage.

14. The method of claim 11, wherein the generating the second reference voltage comprises subtracting the first reference voltage from a source voltage to generate the second reference voltage.

15. The method of claim 11, further comprising coupling a compensation circuit between the first voltage generator and the first voltage regulator.

16. A method for calibrating body bias of a ring oscillator, wherein the ring oscillator comprises a plurality of transistors, the method comprising:
detecting, by a phase detector, a phase difference between an oscillation signal from the ring oscillator and a reference signal, and providing phase detector output signals indicative of the phase difference;
generating, by a first voltage generator using the phase detector output signals, a first reference voltage;
providing, by a first voltage regulator using the first reference voltage, a first regulated voltage as a first biasing voltage;

generating, by a second voltage generator using the first reference voltage, a second reference voltage;

providing, by a second voltage regulator using the second reference voltage, a second regulated voltage as a second biasing voltage; and coupling a compensation circuit between the first voltage generator and the first voltage regulator, wherein the coupling the compensation circuit comprises:

coupling a first transistor with a supply voltage;

coupling a second transistor with the supply voltage;

coupling a third transistor between the first transistor and ground;

coupling a fourth transistor between the second transistor and ground; and coupling a capacitor between a node between the first and the third transistors and a node between the second and the fourth transistors.

17. The method of claim 16, further comprising:

biasing P-wells of the transistors in the ring oscillator using the first biasing voltage; and biasing N-wells of the transistors in the ring oscillator using the second biasing voltage.

18. The method of claim 16, further comprising coupling the first and second transistors as source followers.

19. The method of claim 16, further comprising coupling the first and the second transistors as current sources.

20. The method of claim 19, further comprising:

configuring an output current of the first transistor to be k times an output current of the second transistor; and configuring a transconductance of the third transistor to be k times a transconductance of the fourth transistor.

* * * * *